(12) United States Patent
Ooishi et al.

(10) Patent No.: US 6,201,754 B1
(45) Date of Patent: Mar. 13, 2001

(54) SEMICONDUCTOR MEMORY DEVICE HAVING FUNCTION OF SUPPLYING STABLE POWER SUPPLY VOLTAGE

(75) Inventors: Tsukasa Ooishi; Jun Setogawa, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/514,364

(22) Filed: Feb. 28, 2000

(30) Foreign Application Priority Data

Sep. 2, 1999 (JP) .................................................. 11-248580

(51) Int. Cl.[7] .................................................. G11C 7/00
(52) U.S. Cl. ........................................... 365/226; 365/233
(58) Field of Search ..................................... 365/226, 233, 365/189.07, 189.09

(56) References Cited

U.S. PATENT DOCUMENTS

| | | | |
|---|---|---|---|
| 5,329,168 | * 7/1994 | Sugibayashi et al. | 365/226 |
| 5,783,956 | 7/1998 | Ooishi | 327/157 |
| 5,838,630 | * 11/1998 | Okajima | 365/226 |
| 6,038,189 | * 3/2000 | Morishita | 365/226 |

* cited by examiner

Primary Examiner—Tan T. Nguyen
(74) Attorney, Agent, or Firm—McDermott, Will & Emery

(57) ABSTRACT

The inventive semiconductor memory device comprises a synchronous circuit formed by a PLL circuit requiring precise operations, an internal circuit group and a VDC circuit. The VDC circuit, a capacitor, a PMOS transistor for a dummy current and an NMOS transistor serving as a high impedance element are arranged for the synchronous circuit. The VDC circuit is arranged for the internal circuit group. The VDC circuit eliminates power supply noise. The PMOS transistor stabilizes the operation of a differential amplifier of the VDC circuit. The capacitor keeps potential difference between a power supply side and a GND side constant. The NMOS transistor stabilizes the voltage on the GND side.

8 Claims, 17 Drawing Sheets

SEMICONDUCTOR MEMORY DEVICE HAVING FUNCTION OF SUPPLYING STABLE POWER SUPPLY VOLTAGE

BACKGROUND OF THE INVENTION

1. Field of the Invention

The present invention relates to a semiconductor memory device, and more specifically, it relates to a semiconductor memory device having a structure capable of supplying a stable power supply voltage.

2. Description of the Prior Art

The structure of a conventional semiconductor memory device 9000 is described with reference to FIG. 20. The semiconductor memory device 9000 shown in FIG. 20 has an internal circuit group 990 including memory cells and a synchronous circuit 995 generating an internal clock. The synchronous circuit 995 is driven by an operation start trigger signal and generates the internal clock deciding operation timing in the internal circuit group 990. The synchronous circuit 995 is formed by a PLL circuit or the like, for example.

As shown in FIG. 20, the synchronous circuit 995 and the internal circuit group 990 share a power source 900, to operate with a power supply voltage received from the power source 900 and a ground voltage GND as operating voltages.

The operating voltages must be stable so that the synchronous circuit 995 performs a synchronous operation in high precision.

When the internal circuit group 990 operates, however, noise originates following current consumption to disadvantageously swing the power supply voltage. In the structure of the conventional semiconductor memory device 9000, therefore, precision of the internal clock is disadvantageously damaged following the internal operation.

When the internal circuit group 990 is defective, the power supply voltage or a signal voltage similarly swings. Therefore, influence following a failure of the internal circuit group 990 must be suppressed not only for circuits in the same chip but also for another device connected through the same wire.

SUMMARY OF THE INVENTION

Accordingly, an object of the present invention is to provide a semiconductor memory device having a large operation margin in a high-frequency operation by supplying a stable power supply voltage.

Another object of the present invention is to provide a semiconductor memory device capable of guaranteeing a stable operation of an apparatus connected through the same wire while suppressing influence exerted by a failure.

A semiconductor memory device according to an aspect of the present invention comprises an internal circuit including a memory cell array, a voltage supply node, a synchronous circuit operating on the basis of an operating voltage received from the voltage supply node for generating an internal clock deciding operation timing of the internal circuit, a power source for supplying a voltage to the internal circuit and the voltage supply node, and a voltage stabilizing circuit stabilizing the voltage of the voltage supply node.

Preferably, the voltage stabilizing circuit includes a detection circuit detecting change of the voltage of the voltage supply node and a circuit supplying the voltage from the power source to the voltage supply node in response to an output of the detection circuit.

According to the aforementioned semiconductor memory device, therefore, a precise synchronous operation is guaranteed by arranging a circuit eliminating power supply noise and supplying a stable operating voltage to the synchronous circuit also when the synchronous circuit and the internal circuit use the same power source.

Preferably, the power source includes a first power source corresponding to a first voltage and a second power source supplying a second voltage lower than the first voltage, the voltage supply node includes a first voltage supply node corresponding to the first power source and a second voltage supply node corresponding to the second power source, the voltage stabilizing circuit is provided between the first power source and the first voltage supply node, and the semiconductor memory device further comprises a dummy current generation circuit feeding a dummy current from the first voltage supply node to the second voltage supply node at prescribed timing. More preferably, the dummy current generation circuit includes a transistor provided between the first voltage supply node and the second voltage supply node and rendered conductive at prescribed timing.

The dummy current is fed between the power source supplying an internal voltage to the synchronous circuit and a GND side. Thus, the operation of the detection circuit (differential amplifier) arranged on the side of the power source for detecting change of the operating voltage is stabilized.

Preferably, the power source includes a first power source corresponding to a first voltage and a second power source supplying a second voltage lower than the first voltage, the voltage supply node includes a first voltage supply node corresponding to the first power source and a second voltage supply node corresponding to the second power source, the voltage stabilizing circuit is provided between the first power source and the first voltage supply node, and the semiconductor memory device further comprises a high impedance element raising the impedance between the second voltage supply node and the second power source.

A high impedance component is arranged on the GND side, thereby preventing a ground voltage from mixture with noise.

Preferably, the semiconductor memory device further comprises a voltage change circuit provided between the first voltage supply node and the second voltage supply node for changing the voltages of the first and second voltage supply nodes in the same direction. More preferably, the voltage change circuit includes a capacitive element provided between the first voltage supply node and the second voltage supply node.

The operating voltage of the synchronous circuit can be kept constant by changing the power source side and the GND side in the same direction.

More preferably, the semiconductor memory device further comprises a filter provided between the power source and the voltage stabilizing circuit.

A more stable operating voltage can be supplied to the synchronous circuit by serially connecting the filters between the power source and the synchronous circuit.

A semiconductor memory device according to another aspect of the present invention comprises a pin, an internal circuit, including a memory cell array, operating on the basis of an input from the pin, and a leakage current prevention circuit provided between the pin and the internal circuit for detecting a leakage current from the internal circuit and electrically disconnecting the pin and the internal circuit from each other.

Preferably, the leakage current prevention circuit includes a detection circuit detecting change of an operating voltage of the internal circuit following the leakage current, and a circuit electrically disconnecting the pin and the internal circuit from each other in response to an output of the detection circuit.

Therefore, the aforementioned semiconductor memory device detects an abnormal current (leakage current) generated in the internal circuit and disconnects the pin and the internal circuit from each other. Thus, influence exerted on an external device by the leakage current can be suppressed.

More preferably, the circuit includes a voltage supply circuit supplying an operating voltage to the internal circuit on the basis of a voltage supplied from the pin, and the voltage supply circuit stops supply of the operating voltage to the internal circuit in response to the output of the detection circuit.

Operations of another chip using the same power supply line can be guaranteed by stopping supply of the operating voltage on the basis of a result of detection of the leakage current.

A semiconductor memory device according to still another aspect of the present invention comprises a pin receiving an input from an external device, an internal circuit, including a memory cell array, operating in response to an input from the pin in a normal mode, a voltage supply node, a synchronous circuit operating on the basis of an operating voltage received from the voltage supply node for generating an internal clock deciding operation timing of the internal circuit, and a voltage supply control circuit supplying a voltage from the pin to the voltage supply node in a test mode.

Thus, the aforementioned semiconductor memory device employs the pin used in the normal mode as a power supply pin for the synchronous circuit in the test mode. When a plurality of chips receive the same signal or voltage through the same signal line or power supply line and a leakage current is generated in any of the chips, for example, reduction of the voltage level of the signal line or the power supply line can be prevented by stopping activation of circuits included in the defective chip.

Preferably, the pin includes a first pin corresponding to a first voltage and a second pin supplying a second voltage lower than the first voltage, the voltage supply node includes a first voltage supply node corresponding to the first pin and a second voltage supply node corresponding to the second pin, and the voltage supply control circuit includes a first voltage supply control circuit supplying the voltage from the pin to the first voltage supply node in the test mode and a second voltage supply control circuit supplying the voltage from the pin to the second voltage supply node in the test mode. More preferably, the first voltage supply control circuit operates to stabilize the voltage of the first voltage supply node, and the second voltage supply control circuit operates to stabilize the voltage of the second voltage supply node.

The operating voltage can be stably supplied to the synchronous circuit in the test mode by providing control circuits for supplying the voltage on a power supply side and a GND side respectively.

Preferably, the voltage supply control circuit includes a generation circuit generating a prescribed signal in the test mode, and a switching circuit supplying the input from the pin to the synchronous circuit and an output of the generation circuit to the internal circuit respectively in the test mode while supplying the input from the pin to the internal circuit in the normal mode. More preferably, the switching circuit includes a first switch provided between the pin and the synchronous circuit and turned on in the test mode, a second switch provided between the pin and the internal circuit and turned on in the normal mode, and a third switch provided between the generation circuit and the internal circuit and turned on in the test mode.

In the test mode, the input received from the pin can be supplied to the synchronous circuit as a power supply voltage by employing the internally generated signal in place of a signal received from the normally used pin.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. Parts identical or corre-

First Embodiment

Figure 1:
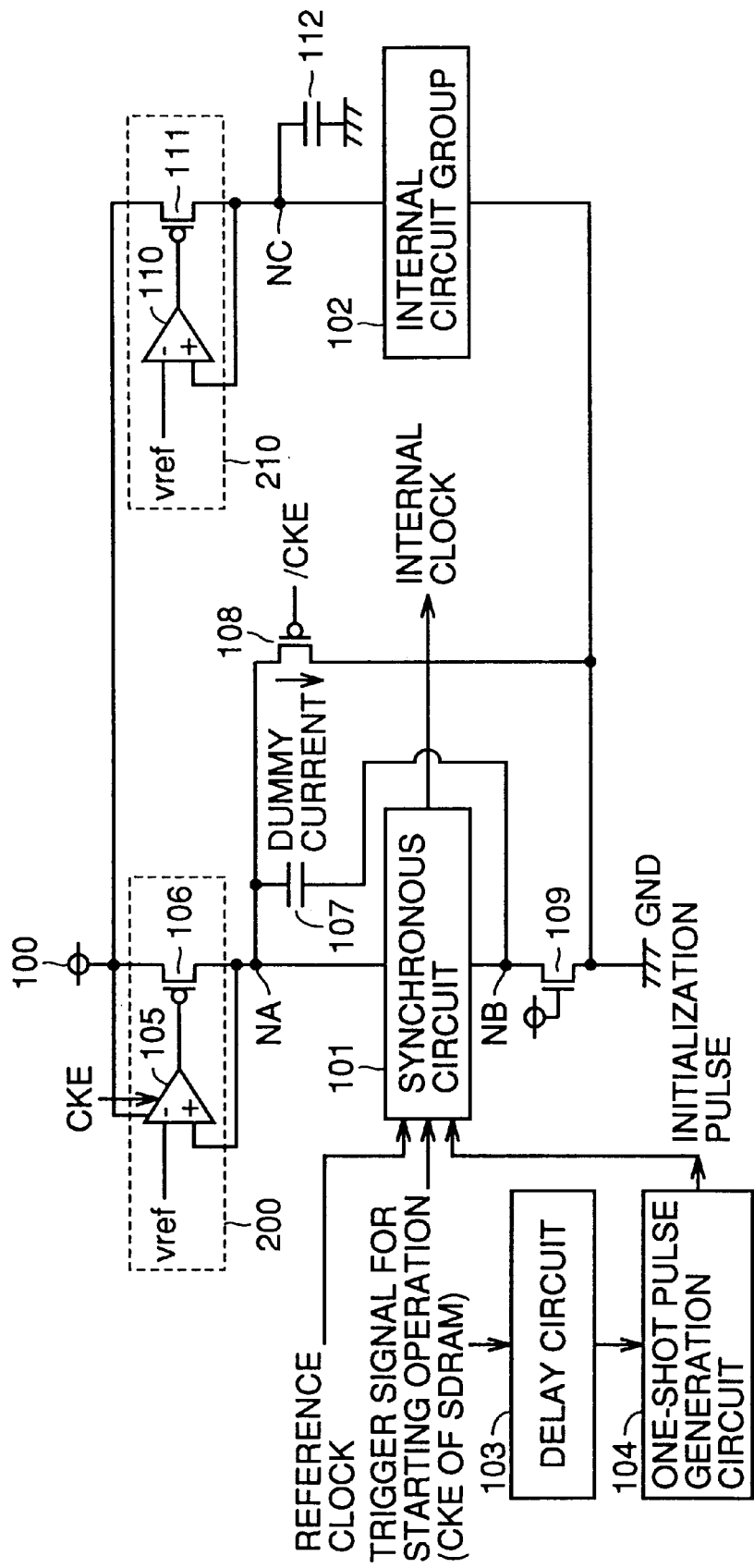
FIG. 1 is a diagram for illustrating the structure of a principal part of a semiconductor memory device according to a first embodiment of the present invention.

The structure of a semiconductor memory device according to a first embodiment of the present invention is described with reference to FIG. 1. The semiconductor memory device shown in FIG. 1 comprises a synchronous circuit 101, an internal circuit group 102, a delay circuit 103 and a one-shot pulse generation circuit 104.

The synchronous circuit 101 is formed by a PLL (phase locked loop) circuit, a DLL (delay locked loop) circuit or the like. The synchronous circuit 101 is activated by an operation start trigger signal (a clock enable signal CKE going high upon activation of a chip in an SDRAM), initialized by an initialization pulse and thereafter generates an internal clock in response to a reference clock (e.g., an external clock).

Figure 2:
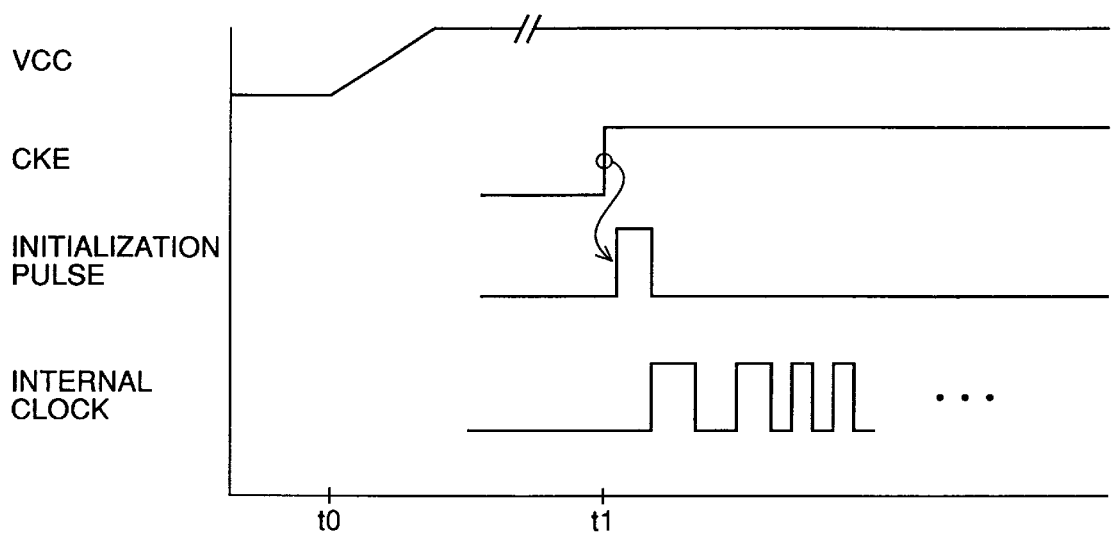
FIG. 2 is a timing chart for illustrating operations of a synchronous circuit 101.

The delay circuit 103 delays and outputs the operation start trigger signal. The one-shot pulse generation circuit 104 generates a one-shot initialization pulse in response to the output from the delay circuit 103. When a power supply voltage VCC goes high at a time t0, the clock enable signal CKE forming the operation start trigger signal goes high at a time t1, as shown in FIG. 2. Thus, the one-shot initialization pulse is generated. The synchronous circuit 101 starts a synchronous operation upon application of the initialization pulse, and generates the internal clock.

Referring again to FIG. 1, the synchronous circuit 101 and the internal circuit group 102 are arranged between a power source 100 and a ground power source (ground voltage) GND. For simplifying the illustration, the power source 100 and the ground power source GND are hereinafter referred to as a power supply side and a GND side respectively. The internal circuit group 102 is formed by a memory cell array, a circuit controlling the operation of the memory cell array, an input/output buffer and the like.

Figure 18:
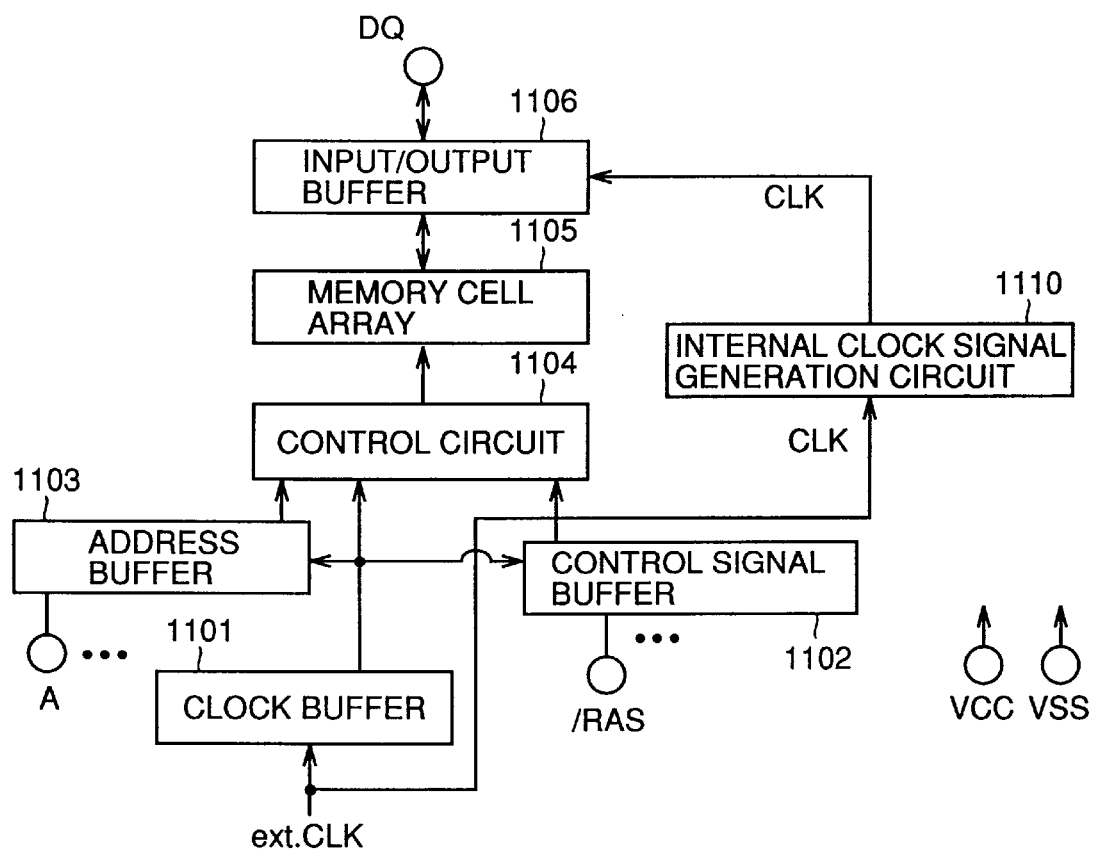
FIGS. 18 and 19 are diagrams showing exemplary association between a synchronous circuit 101 and an internal circuit group 102.

Exemplary association between the synchronous circuit 101 and the internal circuit group 102 is described with reference to FIG. 18. FIG. 18 shows an SDRAM including a clock buffer 1101 capturing an external clock ext.CLK and outputting an internal clock, a control signal buffer 1102 capturing an external control signal (e.g., a row address strobe signal /RAS) on the basis of the output from the clock buffer 1101, an address buffer 1103 capturing an address signal A on the basis of the output from the clock buffer 1101, a control circuit 1104 selecting a memory cell on the basis of the output from the clock buffer 1101 in response to outputs of the control signal buffer 1102 and the address buffer 1103, a memory cell array 1105 including a plurality of memory cells, an input/output buffer 1106 connected with a data input/output pin DQ for outputting data from the selected memory cell or externally receiving data written in the selected memory cell, and an internal clock signal generation circuit 1110 receiving the external clock ext.CLK and generating an internal clock CLK repeating high and low states in a desired phase. Symbols VCC and VSS denote power supply pins. The input/output buffer 1106 operates with reference to the internal clock CLK. The internal clock signal generation circuit 1110 is formed by a PLL circuit or a DLL circuit. The synchronous circuit 101 shown in FIG. 1 corresponds to the internal clock signal generation circuit 1110, for example.

Referring again to FIG. 1, a VDC (voltage down convertor) circuit 200 including a differential amplifier 105 and a PMOS transistor 106 is arranged on the power supply side (voltage supply node NA) of the synchronous circuit 101. The synchronous circuit 101 is supplied with an internal voltage from the node NA through the VDC circuit 200.

The PMOS transistor 106 is connected between the power source 100 and the node NA. The differential amplifier 105 has a positive input terminal connected with the node NA and a negative input terminal supplied with a reference voltage vref. The differential amplifier 105 is activated in response to the clock enable signal CKE and operates on the basis of a voltage supplied from the power source 100. The PMOS transistor 106 is rendered conductive in response to an output of the differential amplifier 105.

An NMOS transistor 109 for generating impedance is arranged on the GND side (voltage supply node NB) of the synchronous circuit 101. The NMOS transistor 109 is connected between the ground power source GND and the node NB, and supplied with the power supply voltage in its gate.

A capacitor 107 is arranged between the nodes NA and NB for stabilizing the voltage supplied to the synchronous circuit 101. The capacitor 107 may be formed by a parallel flat capacitor, a MOS capacitor, a junction capacitor or a memory cell capacitor corresponding to a DRAM.

A PMOS transistor 108 for feeding a dummy current is arranged between the node NA and the ground power source GND. The PMOS transistor 108 is rendered conductive in response to an inverted clock enable signal /CKE obtained by inverting the clock enable signal CLK.

A VDC circuit 210 including a differential amplifier 110 and a PMOS transistor 111 is arranged on the power supply side (voltage supply node NC) of the internal circuit group 102. The internal circuit group 102 is supplied with an internal voltage from the node NC through the VDC circuit 210.

The PMOS transistor 111 is connected between the power source 100 and the node NC. The differential amplifier 110 has a positive input terminal connected with the node NC and a negative input terminal supplied with the reference voltage vref. The PMOS transistor 111 is rendered conductive in response to an output of the differential amplifier 110. A capacitor 112 is arranged between the node NC and the ground power source GND.

The VDC circuit 200 and 210 are thus arranged on the power supply side thereby preventing the voltage of the voltage supply node NA from vibrating in association with noise generated following the operation of the internal circuit group 102. Thus, the synchronous circuit 101 can be supplied with a stable voltage.

Also when the node NA is influenced by noise, the voltages of the nodes NA and NB can be changed in the same direction due to the coupling effect of the capacitor 107 arranged between the power supply side and the GND side of the synchronous circuit 101. In other words, the operating voltage (voltage between the nodes NA and NB) of the synchronous circuit 101 is kept constant.

Further, the operation of the differential amplifier 105 for generating the voltage of the node NA is stabilized due to the provision of the path (the presence of the PMOS transistor 108) for feeding the dummy current. The differential amplifier 105 can stably operate against noise.

The synchronous circuit 101 operates in a chip active period when the clock enable signal CKE goes high. Therefore, the dummy current, which is fed in response to the clock enable signal CKE, is cut while the clock enable signal CKE is low (power down state) for reducing current consumption. Thus, the inverted clock enable signal /CKE is supplied to a gate electrode of the PMOS transistor 108.

The GND side may also be influenced by noise. Therefore, the ON-state NMOS transistor 109 is arranged. The node NB is prevented from influence by noise through such on-state resistance. The NMOS transistor 109 raises the impedance of the node NB, thereby causing the coupling effect by the capacitor 107.

Figure 3:
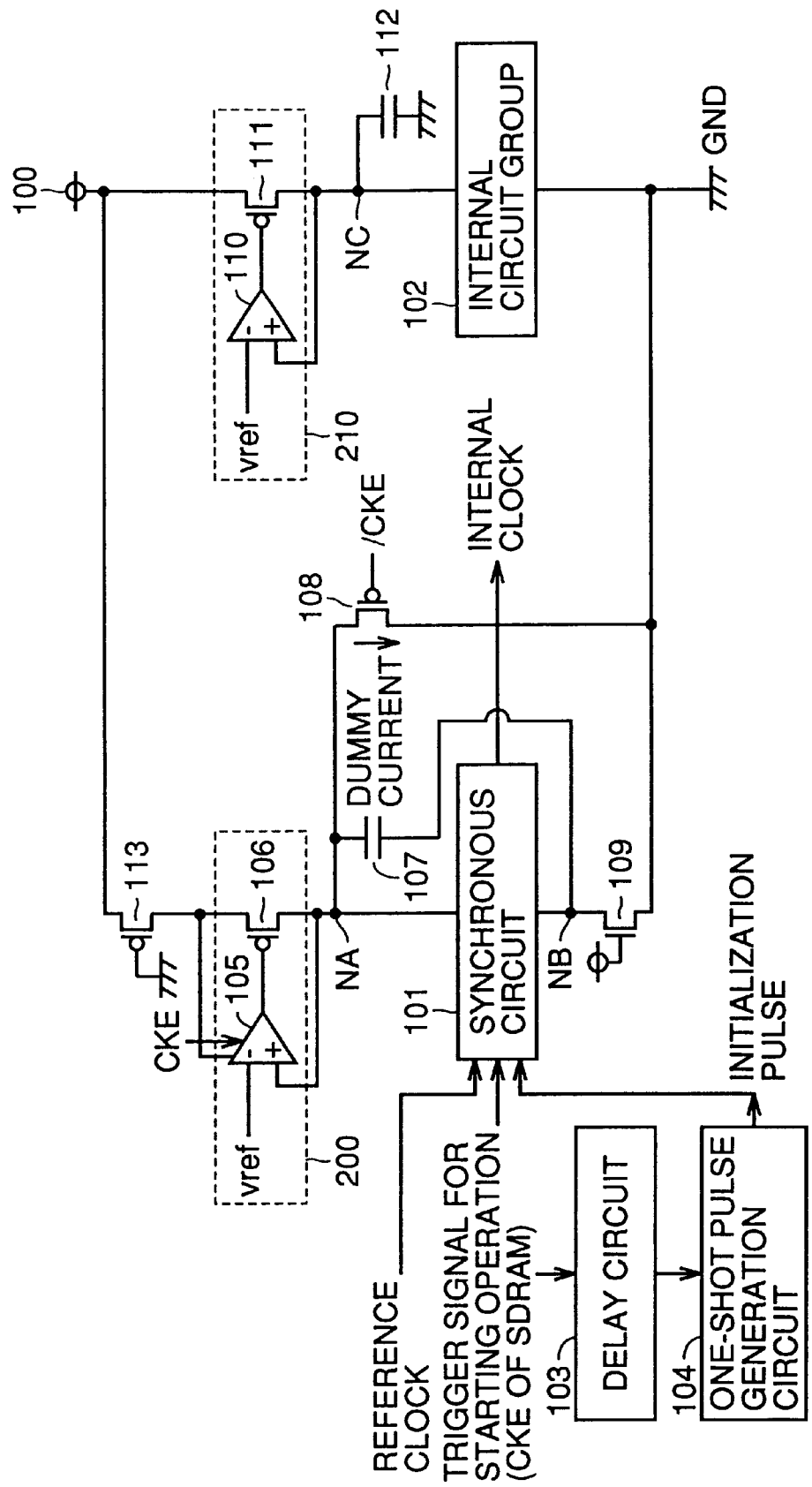
FIG. 3 is a diagram for illustrating another structure of the principal part of the semiconductor memory device according to the first embodiment of the present invention.

Another exemplary structure in the first embodiment of the present invention is described with reference to FIG. 3. The structure shown in FIG. 3 includes a PMOS transistor 113, arranged between a power source 100 and a VDC circuit 200, receiving a ground voltage GND in its gate.

A filter utilizing on-state resistance of the PMOS transistor 113 is arranged for the power source 100 supplying a voltage to the VDC circuit 200. The VDC circuit 200 serves as a filter for a synchronous circuit 101 against the power source 100.

Thus, two filters are serially arranged between the power source 100 and a node NA. Consequently, not only noise in a high-frequency operation but also noise over a wide frequency domain can be cut.

Second Embodiment

The structure of a semiconductor memory device according to a second embodiment of the present invention is described with reference to FIG. 4. After packaging a chip, it is difficult to separately provide an input pin for supplying a new power supply voltage to a test-system circuit. According to the second embodiment of the present invention, a normally used pin (pin used in a mode other than a test mode) is employed as a power supply pin for the test-system circuit. In the second embodiment of the present invention, a synchronous circuit 101 formed by a DLL circuit or the like outputs an internal clock, which is used only in the test mode (the output of the synchronous circuit 101 is hereinafter referred to as an internal test clock).

A VDC circuit 200, a capacitor 118 and a PMOS transistor 114 are arranged on a power supply side of the synchronous circuit 101. According to the second embodiment of the present invention, a differential amplifier 105 included in the VDC circuit 200 operates in response to a test mode signal TEST. A PMOS transistor 106 is connected between a node NA and one conducting terminal of the PMOS transistor 114. The capacitor 118 is connected between the node NA and a ground voltage GND.

The PMOS transistor 114 is connected between a signal input pin PA receiving a signal A and the PMOS transistor 106. The PMOS transistor 114 is rendered conductive in response to a test mode signal /TEST obtained by inverting the test mode signal TEST.

An NMOS transistor 116 is arranged on a GND side of the synchronous circuit 101. The NMOS transistor 116 is connected between a node NB and a signal input pin PB, and rendered conductive in response to the test mode signal TEST.

Figure 4:
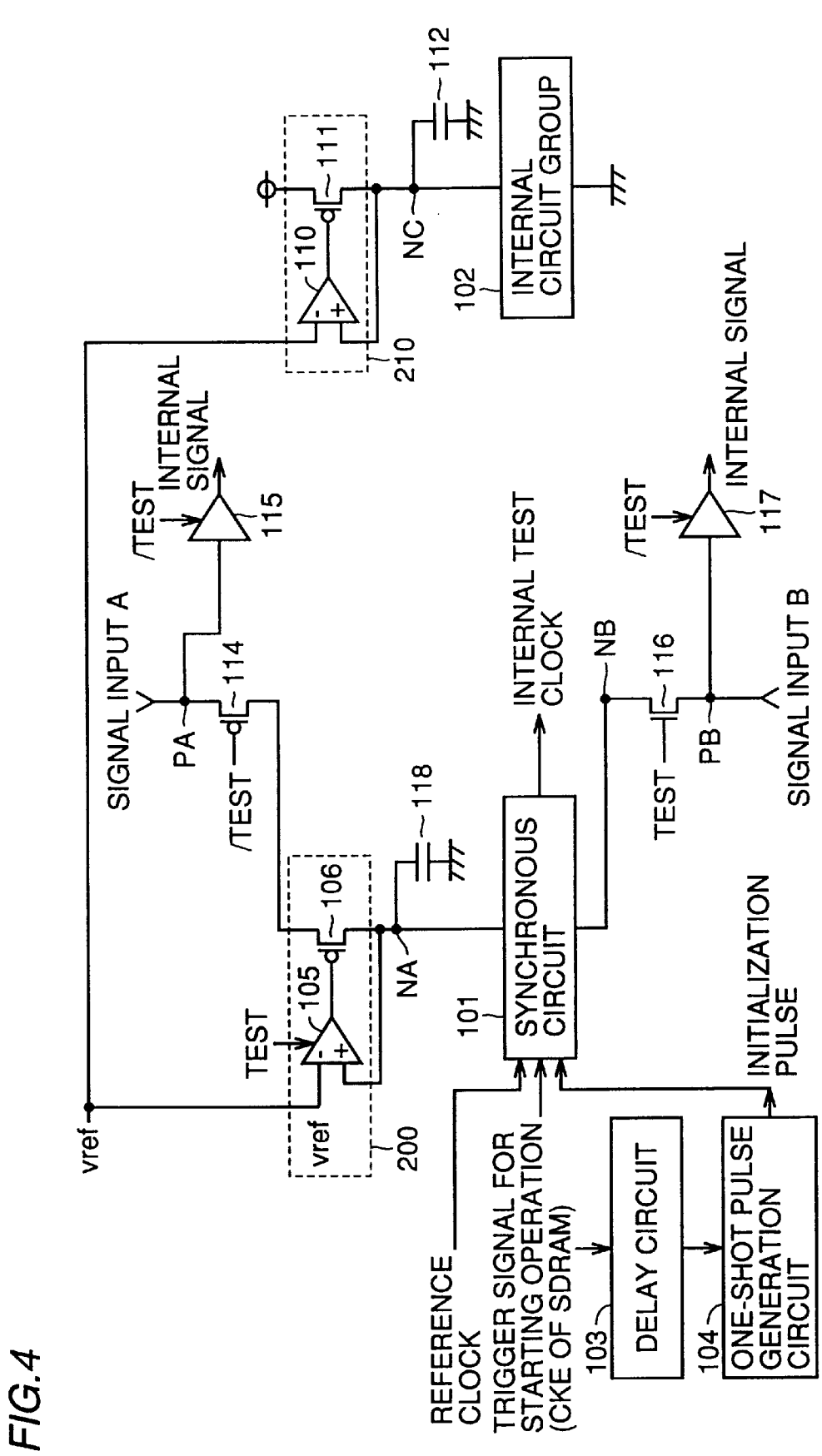
FIG. 4 is a diagram for illustrating the structure of a principal part of a semiconductor memory device according to a second embodiment of the present invention.

In the structure shown in FIG. 4, the synchronous circuit 101 operates when the test mode signal TEST goes high (a specific test mode) and outputs the internal test clock.

A circuit 115 provided for the signal input pin PA captures the signal A in response to the test mode signal /TEST and outputs an internal signal. A circuit 117 provided for the signal input pin PB captures a signal B in response to the test mode signal /TEST and outputs an internal signal. An internal circuit group 102 operates in response to the internal signal in a normal operation mode. A power supply structure for the internal circuit group 102 is identical to that described with reference to the first embodiment.

The signal input pin PA is supplied with the signal A for a normal internal signal system (circuit 115) in the normal mode and supplied with the signal A of the power supply voltage level in the test mode. The signal input pin PB is supplied with the signal B corresponding to a normal internal signal system (circuit 117) in the normal mode and supplied with the signal B of the ground voltage level in the test mode.

Thus, the signal input pins PA and PB can be used as power supply pins for the synchronous circuit 101 defining the test-system circuit. In this case, the internal signals are internally generated if necessary. Alternatively, a pin corresponding to an internal signal not used in the test mode is used as a power supply pin.

Figure 19:
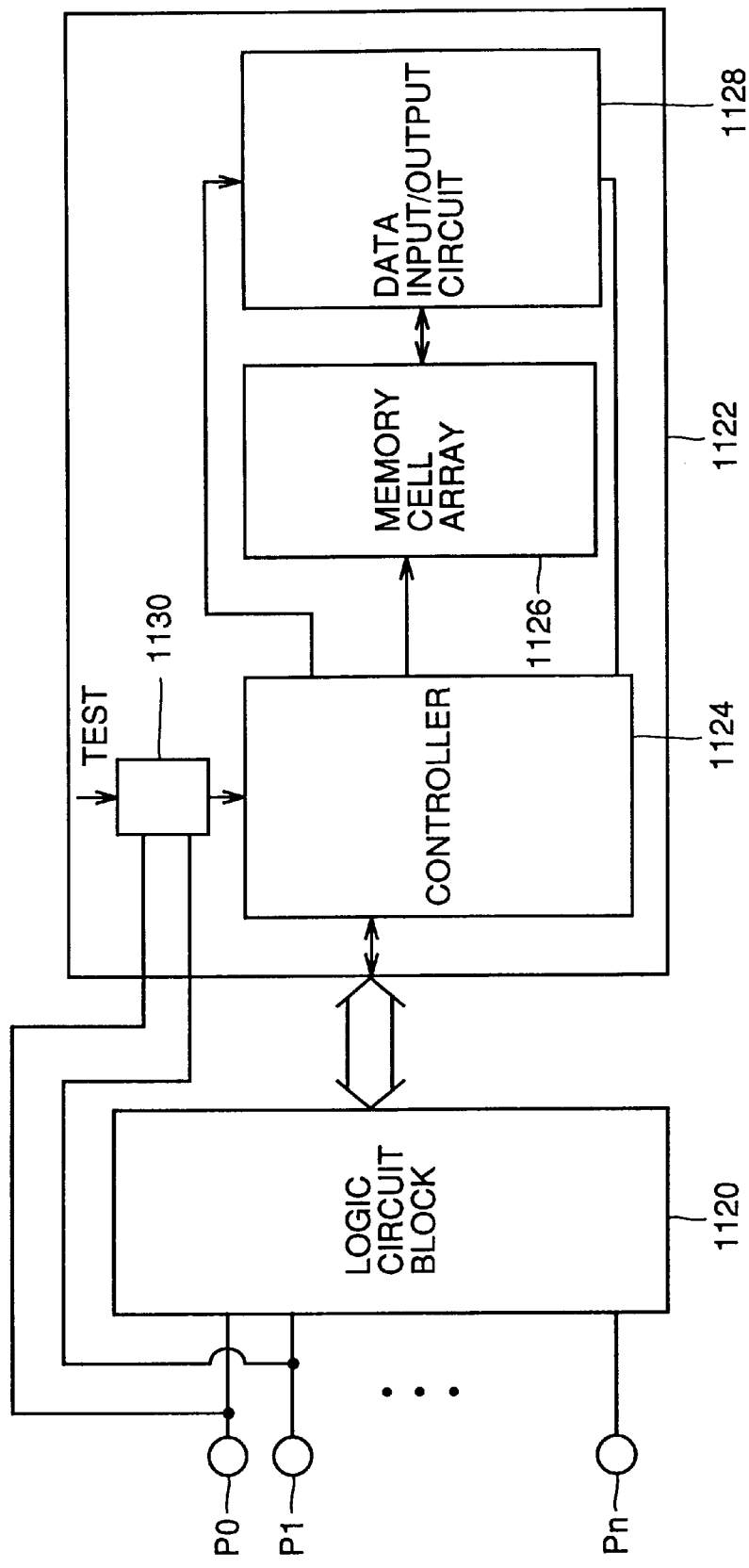
Figure 20:
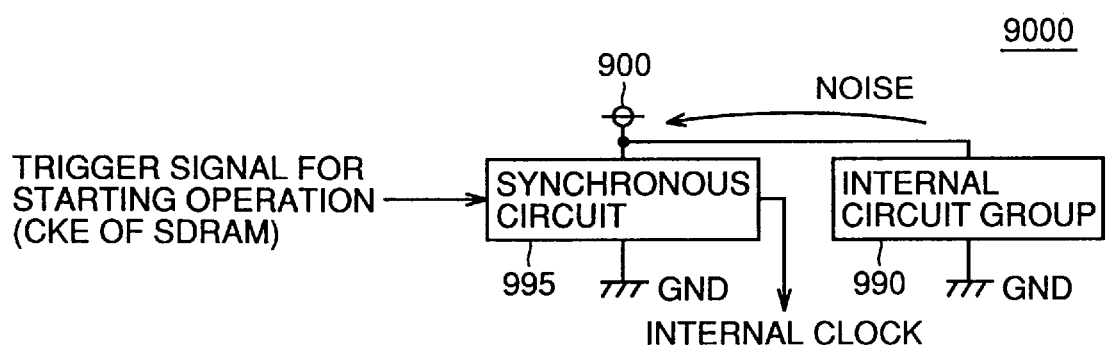
FIG. 20 is a diagram for illustrating a power source in a conventional semiconductor memory device.

Exemplary association between the synchronous circuit 101 and the internal circuit group 102 is described with reference to FIG. 19. In a semiconductor memory device shown in FIG. 19, a logic circuit block 1120 electrically interfacing with an external device, a memory core part 1122 including a memory cell array 1126 transmitting/receiving signals to/from the logic circuit block 1120 are formed on the same substrate. The logic circuit block 1120 transmits/receives signals to/from a device (not shown) through a plurality of external pins P0 to Pn. The memory core part 1122 includes the memory cell array 1126, a data input/output circuit 1128, a controller 1124 controlling operations of the memory cell array 1126 and the data input/output circuit 1128 on the basis of signals received from the logic circuit block 1120 and an internal clock signal generation circuit 1130. The internal clock signal generation circuit 1130 generates an internal test clock in a test mode. For example, the controller 1124 and the data input/output circuit 1128 operate with reference to the internal test clock output from the internal clock signal generation circuit 1130 in the test mode.

In the test mode for the memory cell array 1126, no signal may be input in the logic circuit block 1120. After writing data once, for example, no pin is required for inputting data. At this time, signal supply on the side of the logic circuit block 1120 can be stopped. Therefore, the signal input pins P0 and P1 used for circuit operations of the logic circuit block 1120 in a normal mode are used as power supply pins for the internal clock signal generation circuit 1130, generating the internal test clock in the test mode, included in the memory core part 1122.

The power supply structure for the synchronous circuit 101 is applicable not only to the synchronous circuit 101 but also to all test-system circuits driven only in a test mode.

Thus, power supply pins in the test-system circuit can be dedicated by employing normally used pins not used in the test mode as power supply pins for the test-system circuit. Consequently, the test-system circuit is stabilized in operation, whereby a precise synchronous operation is implemented particularly in the synchronous circuit.

Third Embodiment

Figure 5:
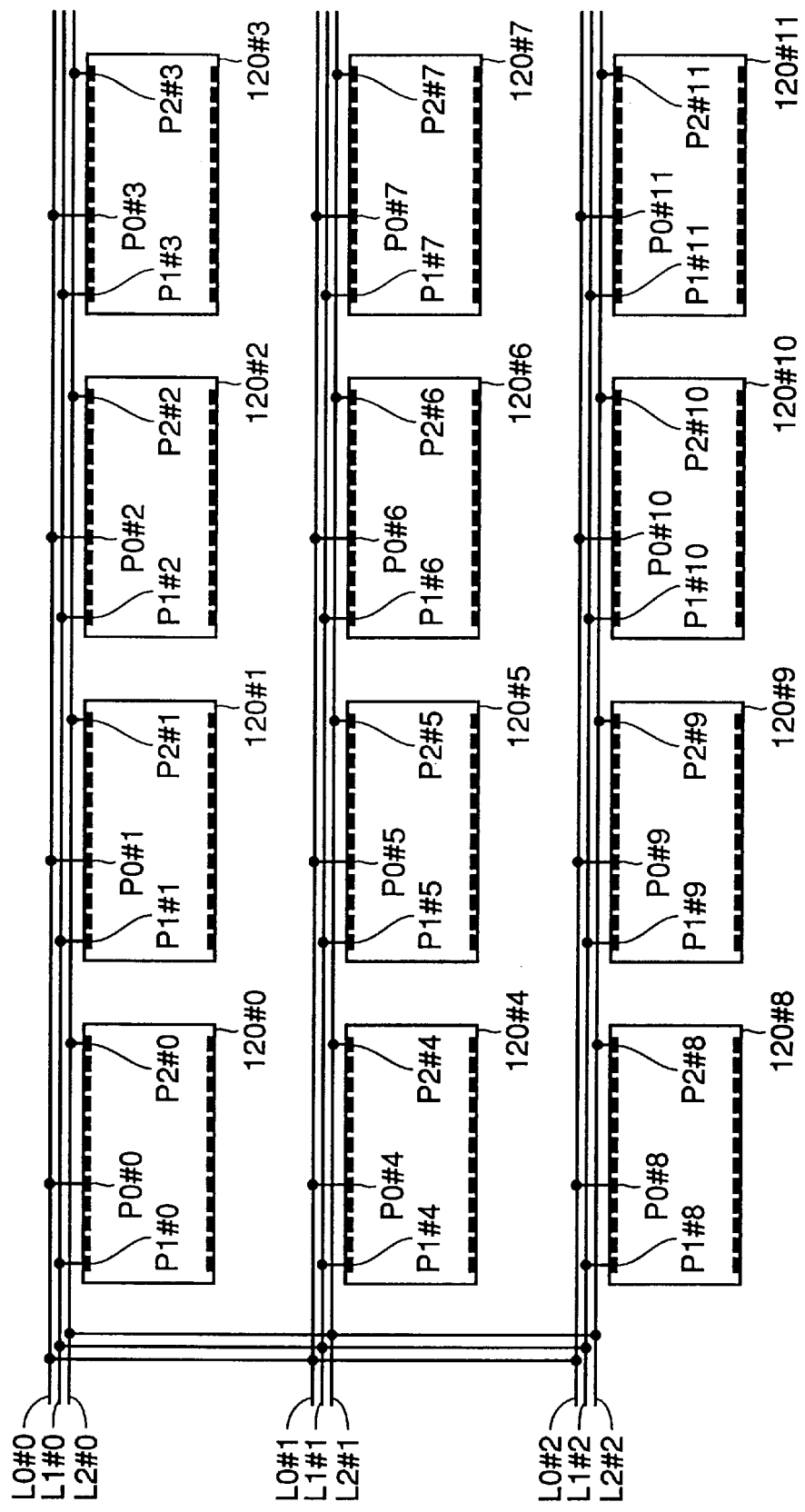
FIG. 5 is a schematic diagram for illustrating a parallel test on a plurality of chips mounted on the same board.

A parallel test for simultaneously testing a plurality of semiconductor memory devices mounted on the same board is now described. FIG. 5 is a schematic diagram for illustrating the parallel test testing a plurality of chips mounted on the same board. Symbols L0#0 to L0#2 denote signal lines and symbols L1#0 to L1#2 and L2#0 to L2#2 denote power supply lines respectively.

A plurality of chips mounted on the same board and subjected to a parallel test share a power source and a signal (row address strobe signal RAS or the like). FIG. 5 representatively shows a plurality of chips 120#0 to 120#11 sharing the signal lines L0#0 to L0#2 and the power supply lines L1#0 to L1#2 and L2#0 to L2#2.

The signal lines L0#0 to L0#2 are coupled with each other and transmit the same signal to the chips 120#0 to 120#11. The power supply lines L1#0 to L1#2 are coupled with each other and supply a voltage of the same level to the chips 120#0 to 120#11. Similarly, the power supply lines L2#0 to L2#2 are coupled with each other and supply a voltage of the same level to the chips 120#0 to 120#11.

If part of the chips 120#0 to 120#11 is defective, the voltage of the shared power supply lines L1#0 to L1#2 and L2#0 to L2#2 or the voltage level of the shared signal lines L0#0 to L0#2 is reduced in the parallel test due to a leakage current flowing from this chip into the signal lines L0#0 to L0#2 or the power supply lines L1#0 to L1#2 and L2#0 to L2#2. Such change of the voltage level disadvantageously influences the results of the test. In other words, a correct test cannot be made.

Figure 6:
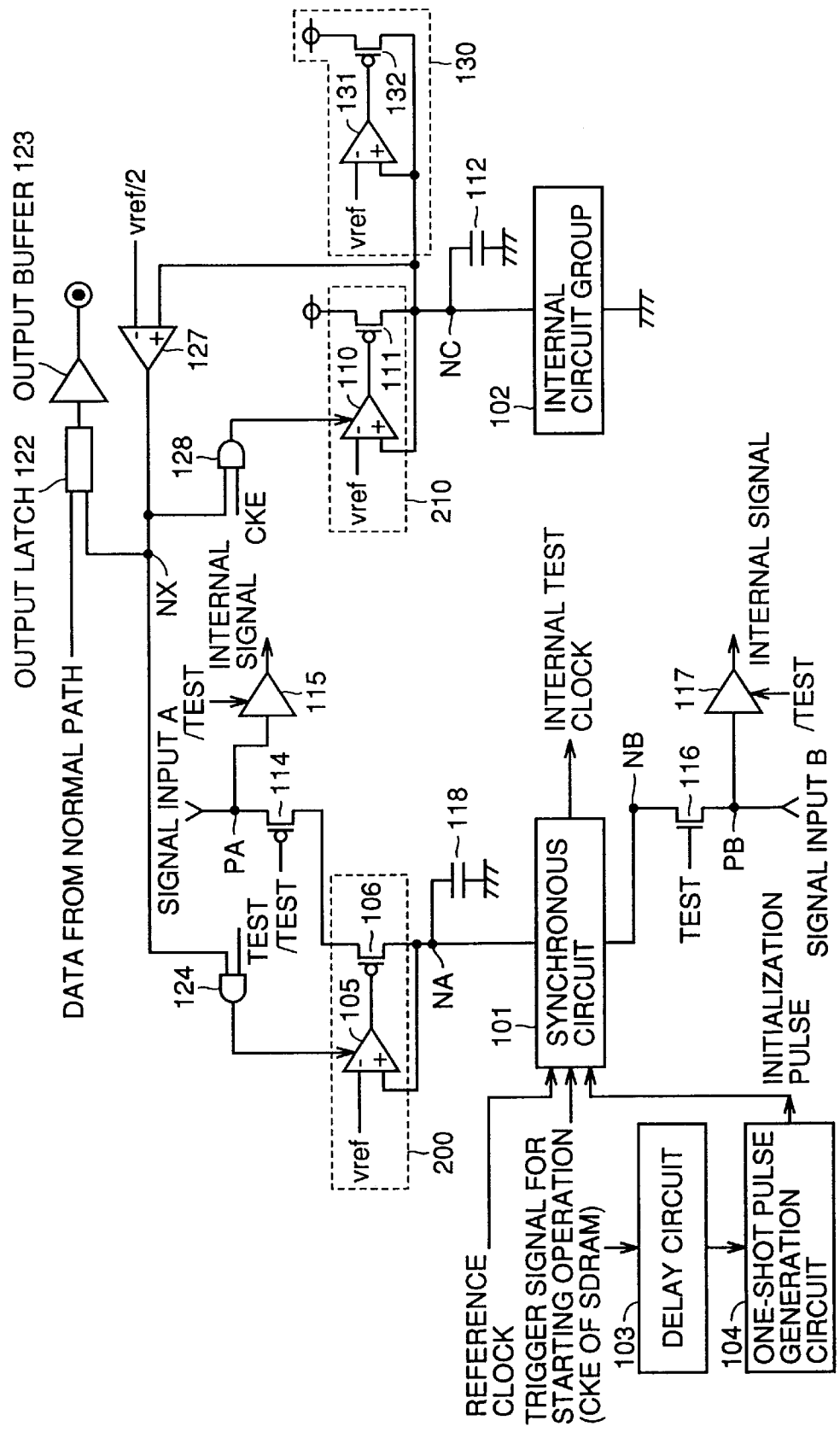
FIGS. 6 and 7 are diagrams for illustrating structures of a principal part of a semiconductor memory device according to a third embodiment of the present invention.

Therefore, circuits for coping with generation of an abnormal current leakage current) for each chip are provided as shown in FIG. 6. A circuit structure according to a third embodiment of the present invention shown in FIG. 6 is now described.

A comparator 127 is arranged for comparing the voltage of a node NC with a prescribed voltage (vref/2 in FIG. 6). A differential amplifier 110 of a VDC circuit 210 operates in response to an output of an AND circuit 128 receiving an output from an output node NX of the comparator 127 and a clock enable signal CKE.

A VDC circuit 130 is arranged for the node NC. The VDC circuit 130 includes a differential amplifier 131 and a PMOS transistor 132. The differential amplifier 131 has a positive input terminal connected with the node NC and a negative input terminal supplied with a reference voltage vref. The PMOS transistor 132 is connected between a power source and the node NC and rendered conductive in response to an output of the differential amplifier 131. The VDC circuit 130 is previously formed to be capable of limiting the quantity of current suppliable to an internal circuit group 102.

A differential amplifier 105 of a VDC circuit 200 operates in response to an output of an AND circuit 124 receiving the output of the node NX and a test mode signal TEST.

When executing a parallel test on the plurality of chips in the arrangement shown in FIG. 5, the VDC circuit 130 is turned on while turning off the VDC circuits 200 and 210 for normal operations in a standby state. The "standby state" indicates a state after starting the parallel state and before activating the chips 120#0 to 120#11.

When the chip is normal, the VDC circuit 130 can normally supply an internal voltage. Therefore, the voltage of the node NX goes high due to comparison of the voltage of the node NC and the prescribed voltage vref/2. Consequently, the VDC circuit 210 for a normal operation is turned on when the chip is activated. When entering a specific test mode (the signal TEST goes high), the VDC circuit 200 is turned on to activate the synchronous circuit 101.

If the internal circuit group 102 is defective and generates a leakage current, however, the VDC circuit 130 cannot supply a sufficient current for supplementing the leakage current. Therefore, the voltage of the node NC is reduced. The voltage of the node NX goes low due to comparison of the voltage of the node NC and the prescribed voltage vref/2. In other words, generation of the leakage current is detected.

When the leakage current is detected, the VDC circuit 210 is not turned on to activate the internal circuit group 102 even if the chip is activated. Also when entering the specific test mode (the signal TEST goes high), the VDC circuit 200 is not turned on to activate the synchronous circuit 101.

Therefore, the VDC circuits 210 and 200 are turned off for a defective chip in the parallel test. Thus, the remaining chips sharing the power supply lines and the signal lines can be prevented from influence by generation of the leakage current.

When outputting presence/absence of generation of the leakage current, an output latch 122 is so formed as to latch data (data read from a memory cell) received from a general path and a signal of the node NX indicating presence/absence of generation of the leakage current (output of the comparator 127). Thus, presence/absence of generation of the leakage current is output through an output buffer 123 receiving data from the output latch 122.

While the determination level in the comparator 127 is vref/2 in the above description, the determination level is not restricted to this but can be arbitrarily set. A voltage for the determination level in the comparator 127 may be externally input or may be internally generated at an arbitrary level.

Figure 7:
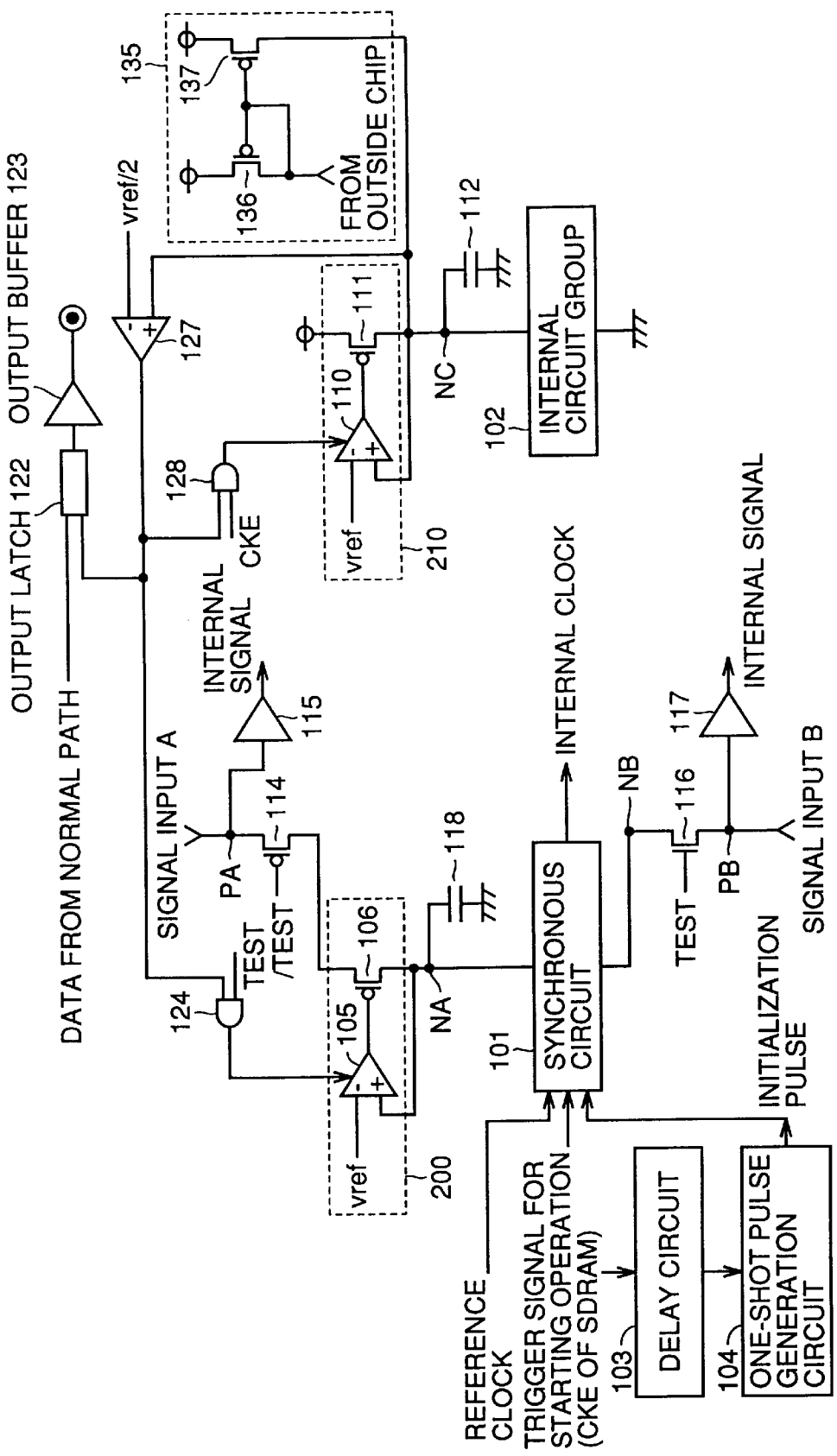

The structure of the VDC circuit 130 is not restricted to that shown in FIG. 6 but a structure shown in FIG. 7 is also employable. Referring to FIG. 7, a VDC circuit 135 including PMOS transistors 136 and 137 is arranged in place of the VDC circuit 130. The PMOS transistor 136 is connected between a power source and a node receiving an input from outside the chip, while the PMOS transistor 137 is connected between the power source and a node NC. Gates of the PMOS transistors 136 and 137 receive a signal from outside the chip. The PMOS transistors 136 and 137 form a current mirror circuit. Thus, the value of a check current for checking a leakage current can be switched by an external input.

The VDC circuits 130 and 135 shown in FIGS. 6 and 7 are dedicated for leakage current detection. It is also possible to apply a general VDC circuit for supplying a small standby current provided on a chip to leakage current detection.

Figure 8:
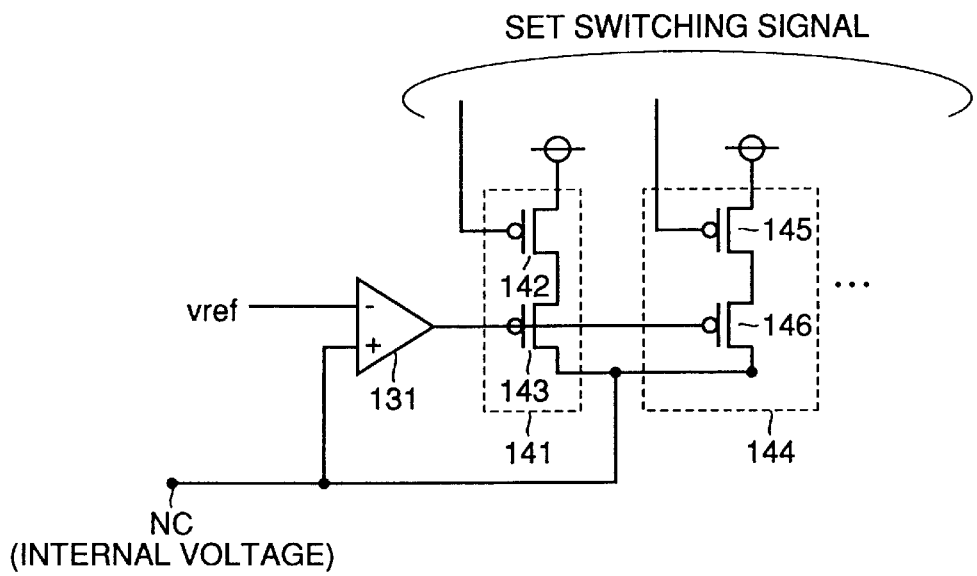
FIG. 8 is a diagram for illustrating another exemplary structure of a circuit for detecting a leakage current.

FIG. 8 shows an exemplary VDC circuit for supplying a small standby current. The circuit shown in FIG. 8 includes a differential amplifier 131 and circuits 141 and 144.

The circuit 141 includes a PMOS transistor 142 rendered conductive in response to an external set switching signal and a PMOS transistor 143 rendered conductive in response to an output of the differential amplifier 131. The PMOS transistors 142 and 143 are serially connected between a power source and the node NC.

The circuit 144 includes a PMOS transistor 145 rendered conductive in response to the external set switching signal and a PMOS transistor 146 rendered conductive in response to the output of the differential amplifier 131. The PMOS transistors 145 and 146 are serially connected between the power source and the node NC.

Suppliability to the node NC is switched by selectively activating the circuits 141 and 144 in response to the set switching signal.

Figure 9:
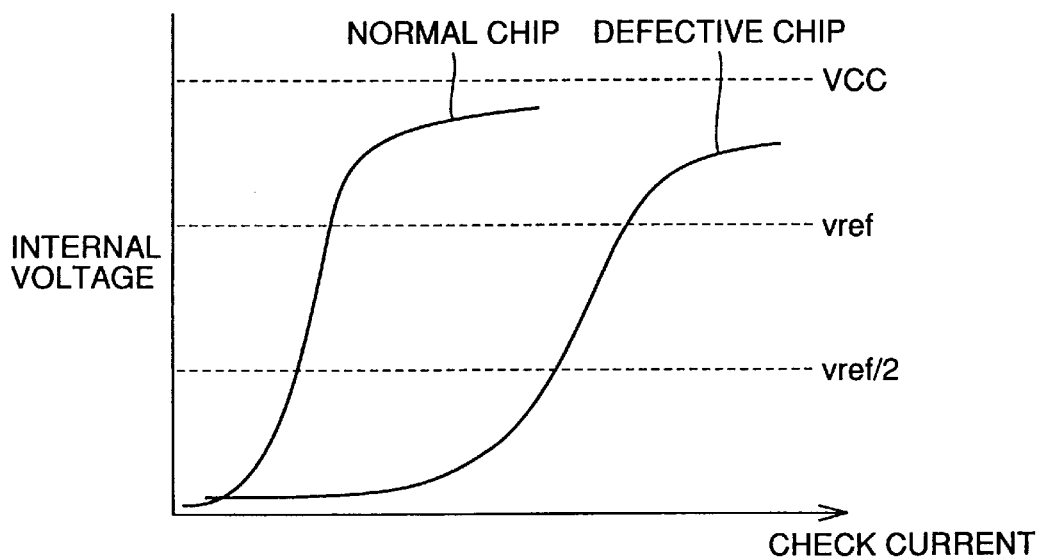
FIG. 9 illustrates the relation between check currents and internal voltages in normal and defective chips respectively.

When a leakage current is generated, an internal voltage is reduced due to insufficient current supply for holding the internal voltage. At this time, the internal voltage abruptly changes from a certain check current value, as shown in FIG. 9. Therefore, a defective chip can be readily detected by properly setting the check current value.

In the aforementioned structure, the VDC circuits 200 and 210 do not operate in chip activation (specific timing) due to reduction of the internal voltage detected in the standby state. However, the present invention is not restricted to this but the detection may be performed in a prescribed test mode for latching the result of this detection so that the VDC circuits 200 and 210 are not turned on in chip activation.

Figure 10:
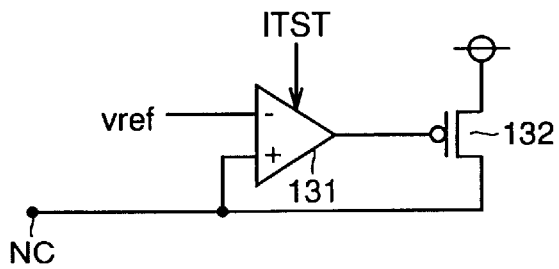
FIG. 10 is a diagram for illustrating still another exemplary structure of the circuit for detecting a leakage current.

For example, the differential amplifier 131 is driven in response to a test mode signal ITST specifying a specific test mode, as shown in FIG. 10. The "test mode" indicates a mode for a current check test, which is different from the test mode in the parallel test.

Figure 11:
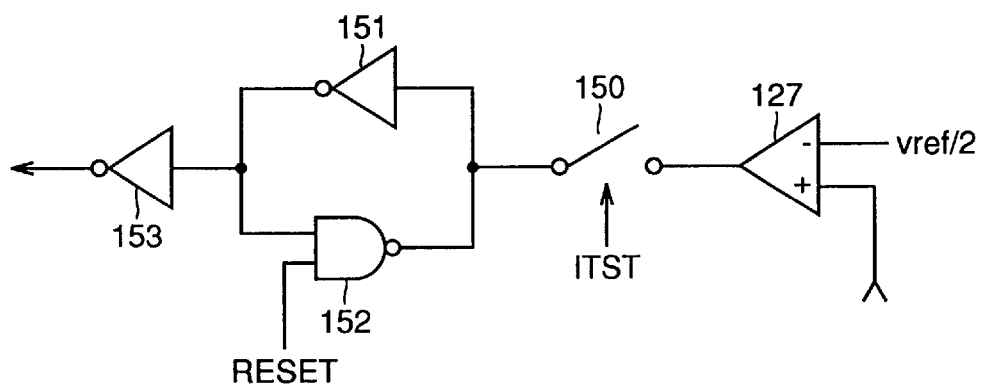
FIG. 11 is a diagram showing a circuit structure for latching an output of a comparator 127.

FIG. 11 illustrates a circuit structure for latching the output of the comparator 127. Referring to FIG. 11, a switch 150, an invertor 151, a NAND circuit 152 and an invertor 153 are arranged for the comparator 127. The switch 150 is turned in response to the test mode signal ITST for connecting a latch circuit formed by the invertor 151 and the NAND circuit 152 with the output of the comparator 127. The NAND circuit 152 forming the latch circuit is reset in response to a reset signal RESET. The invertor 153 inverts an output of the latch circuit. The differential amplifier included in the VDC circuit is driven in response to the output of the invertor 153.

Thus, the semiconductor memory device according to the third embodiment of the present invention can detect a leakage current of a defective chip and prevent the leakage current from flowing out. Therefore, operations of the remaining chips arranged on the same board are guaranteed particularly in a parallel test.

Fourth Embodiment

An outline of a semiconductor memory device according to a fourth embodiment of the present invention is described with reference to FIGS. 12 to 15. In the following description, it is assumed that signals provided with symbol "/" are those obtained by inverting signals provided with no such symbol "/".

Figure 12:
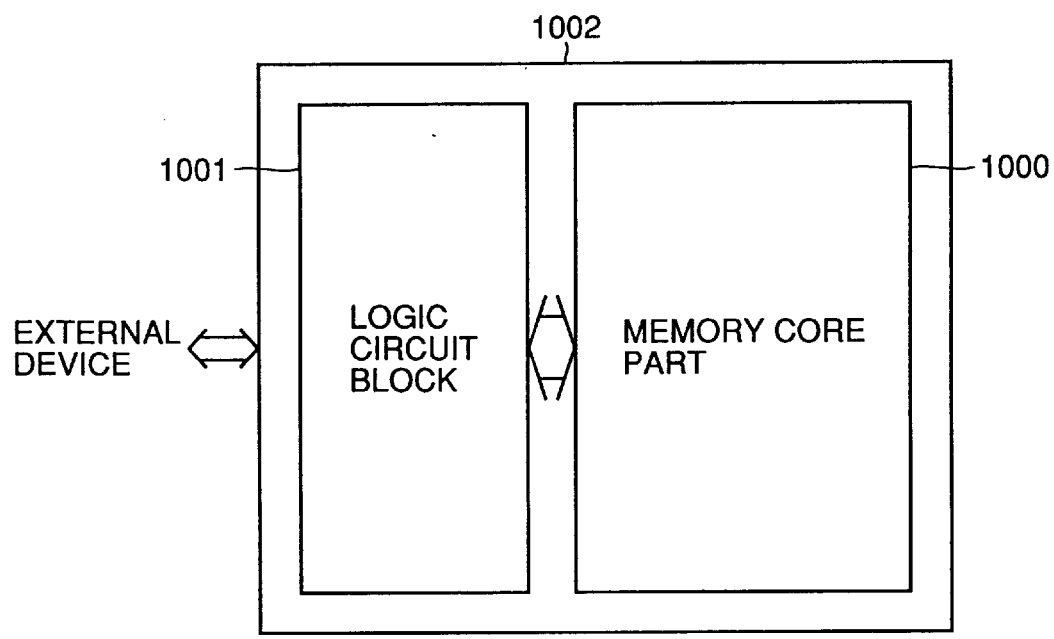
FIG. 12 is a diagram for illustrating a semiconductor memory device according to a fourth embodiment of the present invention.

As shown in FIG. 12, the semiconductor memory device according to the fourth embodiment of the present invention comprises a memory core part 1000 including a DRAM (dynamic random access memory) and a logic circuit block 1001. The memory core part 1000 and the logic circuit block 1001 are formed on the same chip 1002. An SRAM, a gate array, an FPGA, a nonvolatile RAM, a ROM and the like are also carried on the chip 1002, although these elements are not illustrated.

Figure 13:
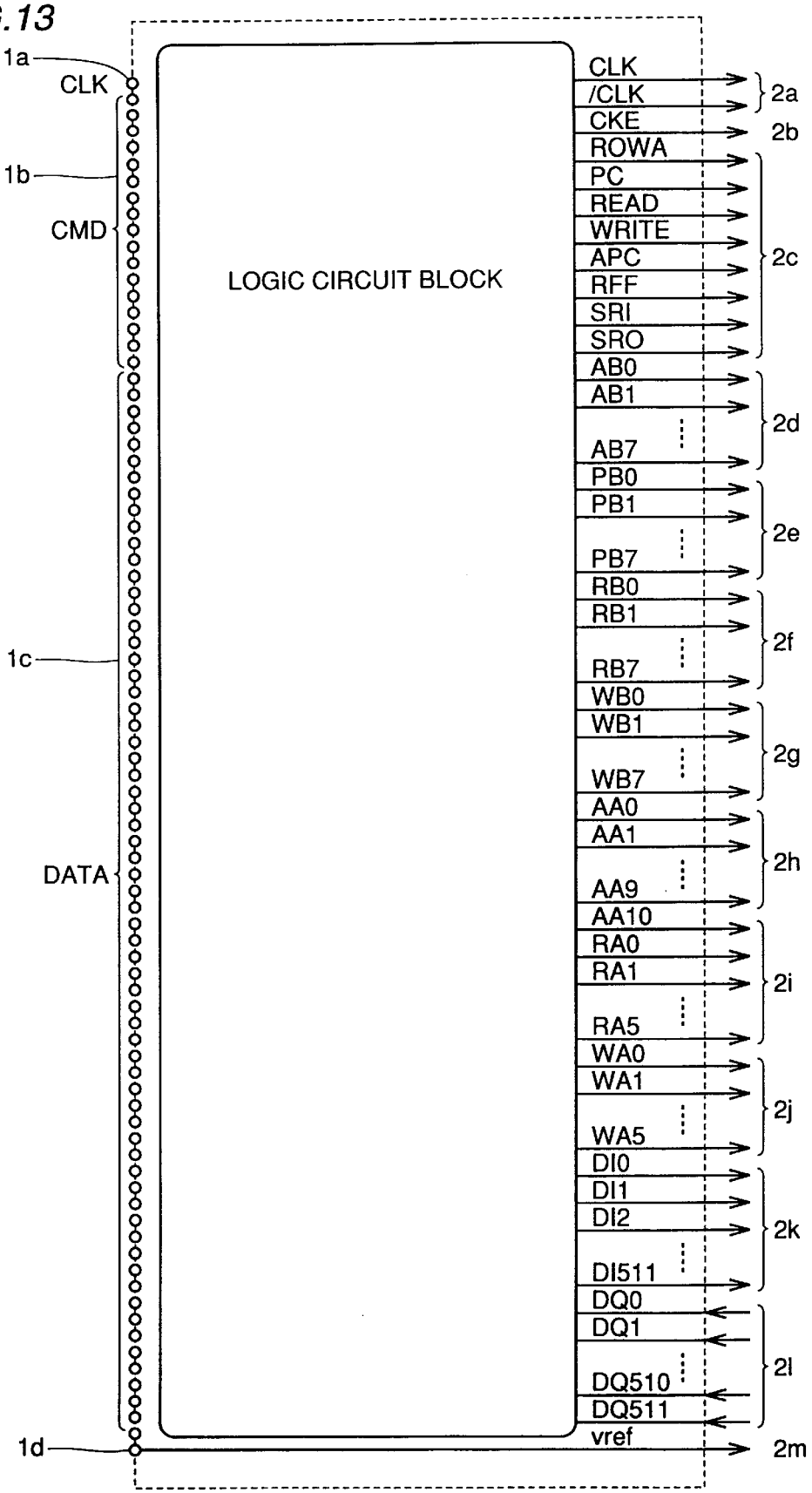
FIG. 13 is a diagram for illustrating a logic circuit block 1001 shown in FIG. 12.

As shown in FIG. 13, the logic circuit block 1001 and the memory core part 1000 transmit/receive signals through connection nodes 2a to 2m. The logic circuit block 1001 transmits commands, addresses and data to the DRAM, while the DRAM responsively transmits data to the logic circuit block 1001.

The logic circuit block 1001 receives an external clock signal CLK, a command CMD and a reference voltage vref from pins 1a, 1b and 1d respectively. The logic circuit block 1001 further inputs/outputs data DATA through a pin 1c.

The logic circuit block 1001 logically processes input signals and outputs corresponding signals to the memory core part 1000. The reference voltage vref received through the pin 1d is output to the node 2m as such.

Figure 14:
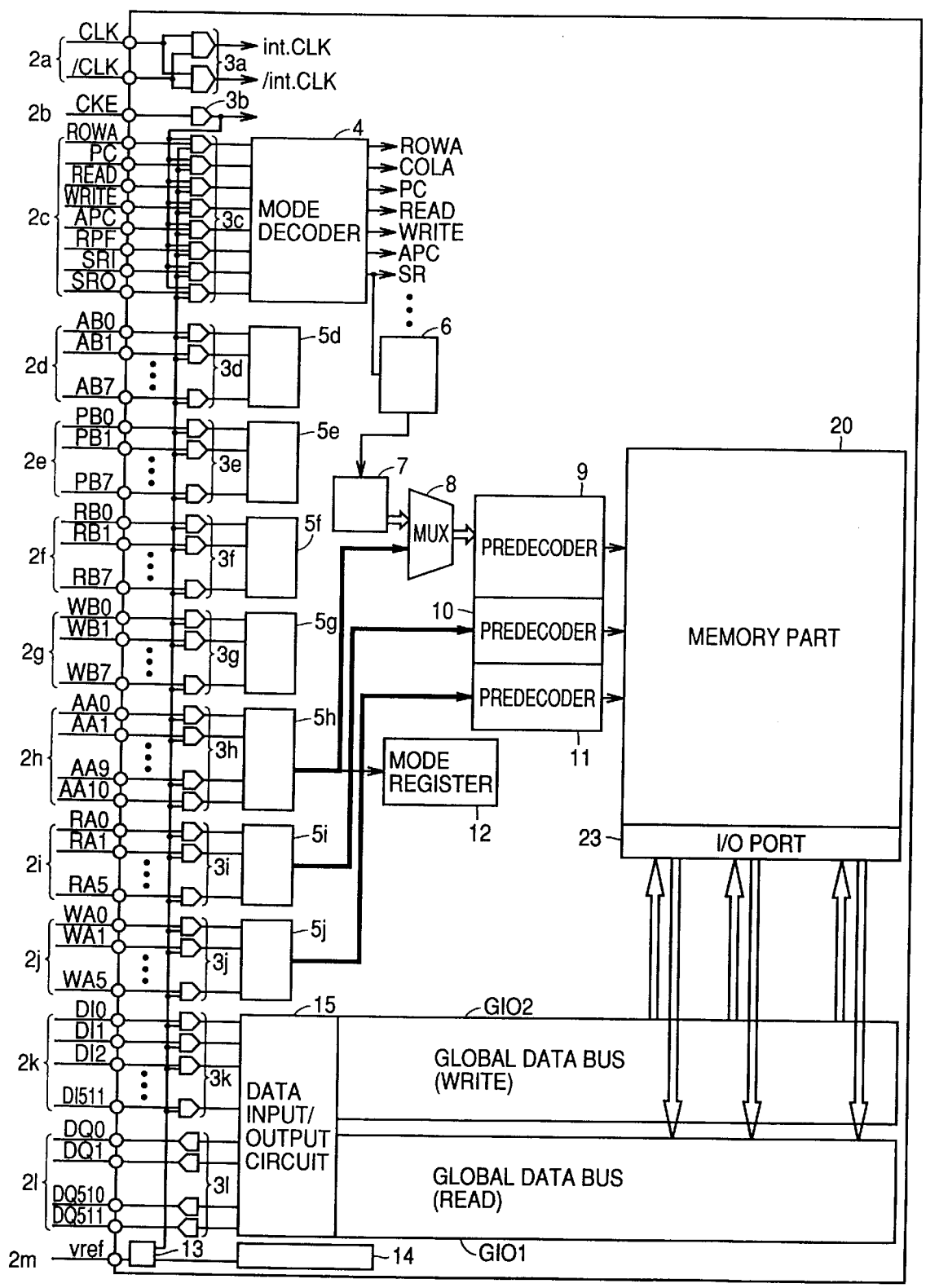
FIG. 14 is a diagram showing an exemplary structure of a memory core part 1000 shown in FIG. 12.

As shown in FIG. 14, the memory core part 1000 is supplied with the following signals through the connection nodes 2a to 2k: The node 2a supplies clock signals CLK and /CLK. The node 2b supplies a clock enable signal CKE. The node 2c supplies control signals, i.e., a signal ROWA indicating activation of a word line, a signal PC related to resetting (precharging) of the word line, a signal READ related to a read operation of a column related circuit, a signal WRITE related to a write operation of the column related circuit, a signal APC instructing an auto precharge operation, a signal REF related to a refresh operation and signals SRI and SWO related to a self refresh mode.

Four commands of the signals ROWA, PC, READ, WRITE in total can be simultaneously generated at the maximum.

The node 2d supplies act bank signals AB0 to AB7. The act bank signals AB0 to AB7 specify banks to be accessed in access to row and column respectively. The node 2e supplies precharge bank signals PB0 to PB7. The node 2f supplies read bank signals RB0 to RB7, and the node 2g supplies write bank signals WB0 to WB7.

The node 2h supplies act address signals AA0 to AA10, the node 2i supplies read address signals RA0 to RA5, and the node 2j supplies write address signals WA0 to WA5.

The node 2k supplies input data DI0 to DI511. Output data DQ0 to DQ511 from the memory core part 1000 are transmitted to the logic circuit block 1001 through the node 2l.

The memory core part 1000 includes buffers 3a to 3l, a mode decoder 4, an act bank latch 5d, a precharge bank latch 5e, a read bank latch 5f, a write bank latch 5g, a row address latch 5h, a read address latch 5i, a write address latch 5j, a self refresh timer 6, a refresh address counter 7, a multiplexer 8, predecoders 9, 10 and 11, a mode register 12, a reference voltage control circuit 13 and a synchronous circuit 14.

The buffer 3a receives the clock signals CLK and /CLK and outputs internal clock signals int.CLK and /int.CLK. Each of the buffers 3c to 3k is supplied with the reference voltage vref from the reference voltage control circuit 13. The buffer 3b receives the clock enable signal CKE. The buffer 3c operates in response to an output of the buffer 3b and captures the control signals received in the node 2c. The mode decoder 4 receives an output of the buffer 3c and outputs internal control signals (signals ROWA, COLA, PC, READ, WRITE, APC and SR).

The act bank latch 5d latches the act bank signals AB0 to AB7 through the buffer 3d. The precharge bank latch 5e latches the precharge bank signals PB0 to PB7 through the buffer 3e. The read bank latch 5f latches the read bank signals RB0 to RB7 through the buffer 3f. The write bank latch 5g latches the write bank signals WB0 to WB7 through the buffer 3g. The row address latch 5h latches the act address signals AA0 to AA10 through the buffer 3h. The read address latch 5i latches the read address signals RA0 to RA5 through the buffer 3i. The write address latch 5j latches the write address signals WA0 to WA5 through the buffer 3j.

The buffer 3k captures the input data DI0 to DI511. The buffer 3l captures data output from a data input/output circuit 15 and outputs the same to the node 2l.

The self refresh timer 6 receives the signal SR output from the mode decoder 4 and starts an operation. The refresh address counter 7 generates an address for performing a refresh operation in accordance with an instruction of the self refresh timer 6. The multiplexer 8 outputs the output from the row address latch 5h in a normal operation, while outputting the output of the refresh address counter 7 in a self refresh operation. The predecoder 9 predecodes a row address received from the multiplexer 8. The predecoder 10 decodes a column address received from the read address latch 5i. The predecoder 11 decodes a column address received from the write address latch 5j. The mode register 12 holds information (e.g., data corresponding to a burst length) corresponding to a prescribed operation mode in response to the output of the row address latch 5h.

A global data bus GIO1 transmits data read from a memory part 20 to the data input/output circuit 15. A global data bus GIO2 transmits input data received in the data input/output circuit 15 to the memory part 20.

Figure 15:
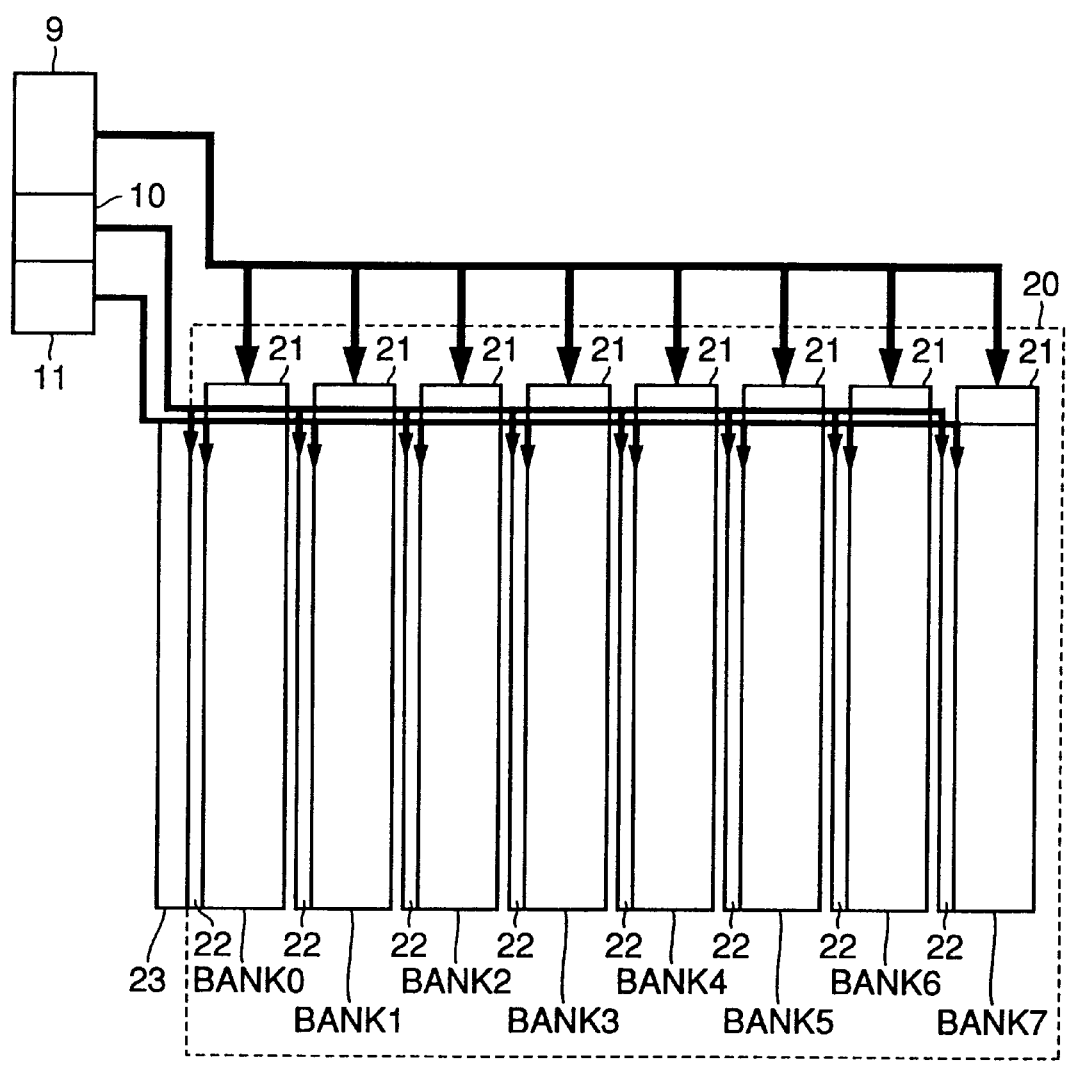
FIG. 15 is a diagram for illustrating the structure of a memory part 20.

The memory part 20 is divided into banks BANK0 to BANK7, as shown in FIG. 15. Each bank includes a plurality of memory cells arranged in rows and columns, a plurality of word lines arranged in correspondence to the rows, and a plurality of bit lines arranged in correspondence to the columns. Each memory cell is formed by a memory cell capacitor storing information in the form of charges and a memory cell transistor having a gate electrode connected with a corresponding word line, a first conducting terminal connected with a corresponding bit line and a second conducting terminal connected with the memory cell capacitor.

A row decoder 21 and a column decoder 22 are arranged for each bank. The row decoder 21 selects a corresponding row direction in response to the output of the predecoder 9. The column decoder 22 selects the corresponding column direction in response to the outputs of the predecoders 10 and 11.

The banks BANK0 to BANK7 transmit/receive data to/from the global data buses GIO1 and GIO2 through an I/O port 23.

Each bank is controlled by a bank address. The bank address exists in correspondence to each command. For example, a word line of the corresponding bank is activated in accordance with the signal ROWA and the act bank signal ABn (n=0 to 7). The word line of the corresponding bank is reset in accordance with the signal PC and the precharge bank signal PBn (n=0 to 7). Data is read from a sense amplifier of the corresponding bank in accordance with the signal READ and the read bank signal RBn (n=0 to 7). Data is written in the sense amplifier of the corresponding bank in accordance with the signal WRITE and the write bank signal WBn (n=0 to 7).

The relation between the reference voltage control circuit 13 and the synchronous circuit 14 is now described. The synchronous circuit 14 formed by a PLL circuit or the like generates an internal test clock in a test mode.

In the test mode, the memory core part 1000 operates with reference to the internal test clock in place of the internal clock int.CLK output from the buffer 3a, for example. Alternatively, a partial circuit (data input/output circuit 15) operates with reference to the internal test clock in place of the internal clock int.CLK.

Figure 16:
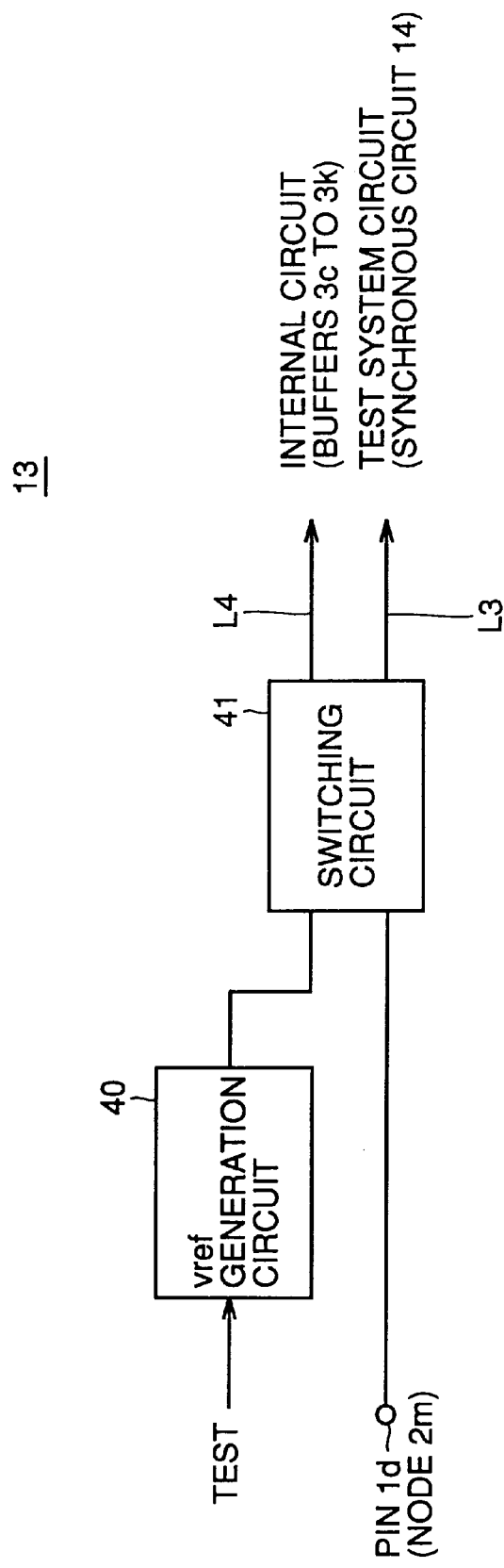
FIG. 16 is a diagram showing an outline of the structure of a reference voltage control circuit 13.

As shown in FIG. 16, the reference voltage control circuit 13 includes a vref generation circuit 40 and a switching circuit 41. The vref generation circuit 40 generates a reference voltage in response to the test mode signal TEST.

In the test mode, the switching circuit 41 connects the pin 1d (node 2m) with a power supply line L3 for supplying a voltage to the synchronous circuit 14 and electrically connects an internal vref line L4 supplying the reference voltage to the buffers 3c to 3k with an output node of the vref generation circuit 40. In a normal mode, the switching circuit 41 electrically connects the pin 1d with the internal vref line L4.

In the normal mode, the reference voltage vref input from the pin 1d (external) decides the threshold voltages of the input buffers 3c to 3k. At this time, the synchronous circuit 14, which is a test-system circuit, is stopped. In the test mode, the pin 1d is used as a pin for supplying a power supply voltage to the synchronous circuit 14. At this time, the internally generated reference voltage is supplied to the buffers.

Figure 17:
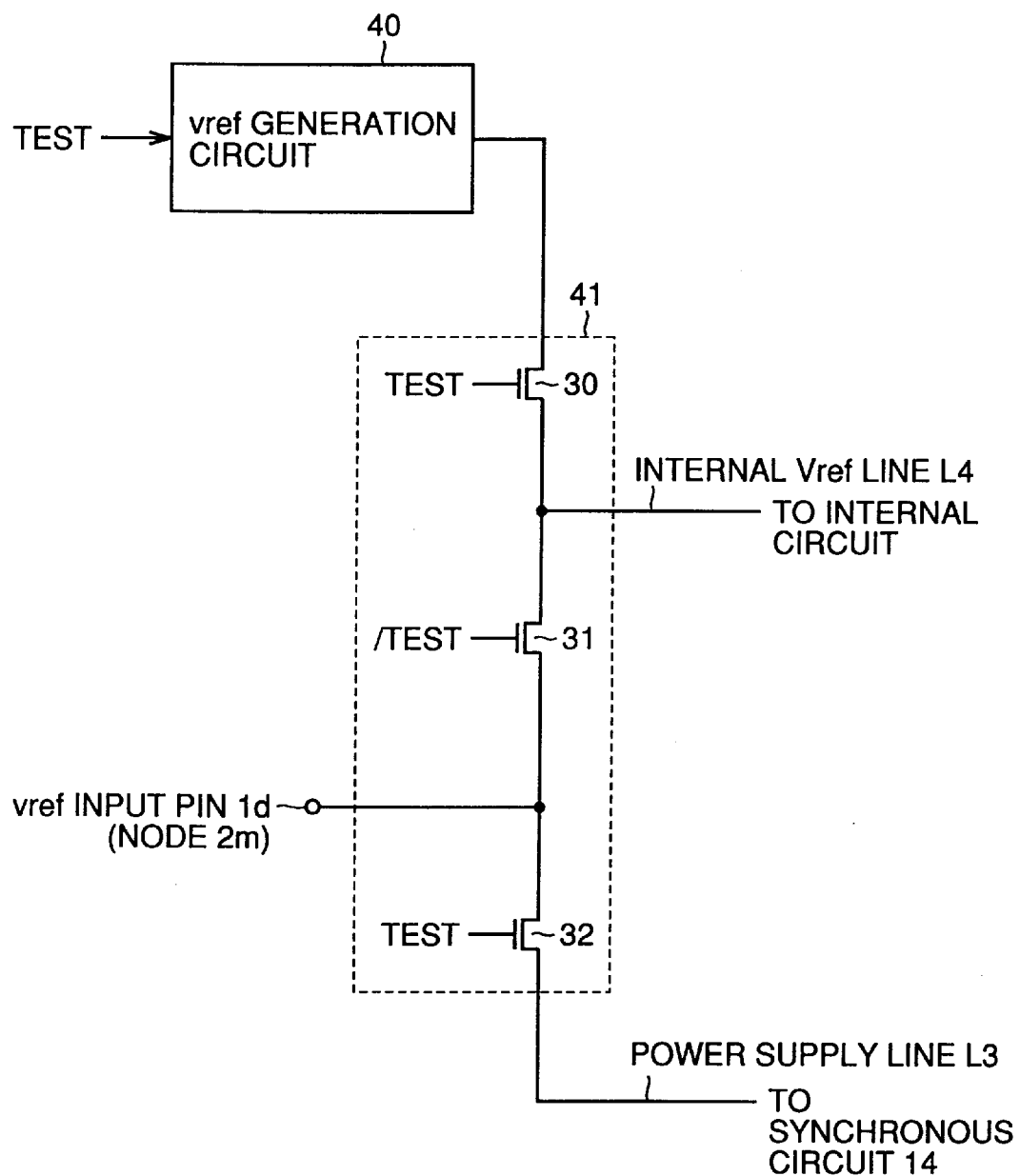
FIG. 17 is a diagram showing an exemplary structure of the reference voltage control circuit 13.

A specific example of the reference voltage control circuit 13 is described with reference to FIG. 17. The switching circuit 41 is formed by NMOS transistors 30, 31 and 32. Each of the NMOS transistors 30 and 32 receives the test mode signal TEST in its gate, while the NMOS transistor 31 receives the test mode signal /TEST in its gate.

The NMOS transistor 30 is arranged between the internal vref line L4 and the output node of the vref generation circuit 40. The NMOS transistor 32 is arranged between the pin 1d (node 2m) and the power supply line L3. The NMOS transistor 31 is arranged between the pin 1d (node 2m) and the internal vref line L4. The vref generation circuit 40 generates a prescribed reference voltage vref in response to the test mode signal TEST.

The voltage of the internal vref line L4 changes in response to a signal output from the vref generation circuit 40 when the test mode signal TEST goes high, and changes in response to the reference voltage vref received in the pin 1d when the test mode signal TEST goes low in the normal mode.

When the test mode signal TEST goes high, the voltage of the power supply line L3 changes in response to the voltage received in the pin 1d.

Thus, the pin 1d used in the normal mode can be used as a pin for supplying the power supply voltage without separately providing an input pin for supplying the power supply voltage to the test-system circuit (synchronous circuit). Consequently, a stable power supply voltage can be supplied to the test-system circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an internal circuit including a memory cell array;
    a voltage supply node;
    a synchronous circuit operating on the basis of an operating voltage received from said voltage supply node for generating an internal clock deciding operation timing of said internal circuit;
    a power source for supplying a voltage to said internal circuit and said voltage supply node; and
    a voltage stabilizing circuit stabilizing the voltage of said voltage supply node.

2. The semiconductor memory device in accordance with claim 1, wherein
    said voltage stabilizing circuit includes:
        a detection circuit detecting change of the voltage of said voltage supply node, and
        a circuit supplying the voltage from said power source to said voltage supply node in response to an output of said detection circuit.

3. The semiconductor memory device in accordance with claim 2, wherein
    said power source includes:
        a first power source corresponding to a first voltage, and
        a second power source supplying a second voltage lower than said first voltage,
    said voltage supply node includes:
        a first voltage supply node corresponding to said first power source, and a second voltage supply node corresponding to said second power source, said voltage stabilizing circuit is provided between said first power source and said first voltage supply node, and said semiconductor memory device further comprises a dummy current generation circuit feeding a dummy current from said first voltage supply node to said second voltage supply node at prescribed timing.

4. The semiconductor memory device in accordance with claim 3, wherein said dummy current generation circuit includes:
a transistor provided between said first voltage supply node and said second voltage supply node and rendered conductive at prescribed timing.

5. The semiconductor memory device in accordance with claim 2, wherein said power source includes:
a first power source corresponding to a first voltage, and
a second power source supplying a second voltage lower than said first voltage, said voltage supply node includes:
a first voltage supply node corresponding to said first power source, and
a second voltage supply node corresponding to said second power source, said voltage stabilizing circuit is provided between said first power source and said first voltage supply node, and said semiconductor memory device further comprises a high impedance element raising the impedance between said second voltage supply node and said second power source.

6. The semiconductor memory device in accordance with claim 2, wherein said power source includes:
a first power source corresponding to a first voltage, and
a second power source supplying a second voltage lower than said first voltage, said voltage supply node includes:
a first voltage supply node corresponding to said first power source, and
a second voltage supply node corresponding to said second power source, said voltage stabilizing circuit is provided between said first power source and said first voltage supply node, and said semiconductor memory device further comprises a voltage change circuit provided between said first voltage supply node and said second voltage supply node for changing the voltage of said first voltage supply node and the voltage of said second voltage supply node in the same direction.

7. The semiconductor memory device in accordance with claim 6, wherein said voltage change circuit includes:
a capacitive element provided between said first voltage supply node and said second voltage supply node.

8. The semiconductor memory device in accordance with claim 2, further comprising a filter provided between said power source and said voltage stabilizing circuit for cutting noise of said power source.

* * * * *